(12) United States Patent
Park et al.

(10) Patent No.: US 11,050,413 B2
(45) Date of Patent: Jun. 29, 2021

(54) LATCHED COMPARATOR, CLOCK GENERATION CIRCUIT AND SEMICONDUCTOR APPARATUS RELATING TO THE LATCHED COMPARATOR

(71) Applicant: SK hynix Inc., Icheon-si (KR)

(72) Inventors: Gyu Tae Park, Icheon-si (KR); Young Ouk Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/559,225

(22) Filed: Sep. 3, 2019

(65) Prior Publication Data
US 2020/0266803 A1 Aug. 20, 2020

(30) Foreign Application Priority Data
Feb. 18, 2019 (KR) .......................... 10-2019-0018492

(51) Int. Cl.
*H03K 3/0233* (2006.01)
*H03K 5/135* (2006.01)
*G11C 7/22* (2006.01)

(52) U.S. Cl.
CPC ........... *H03K 3/0233* (2013.01); *G11C 7/222* (2013.01); *H03K 5/135* (2013.01)

(58) Field of Classification Search
CPC .................................. G11C 7/222; H03K 5/135
See application file for complete search history.

(56) References Cited

U.S. PATENT DOCUMENTS

| 6,380,801 | B1 * | 4/2002 | McCartney | ........... | H03F 3/3064 |
| | | | | | 330/255 |
| 6,441,649 | B1 * | 8/2002 | Martin | ............... | H03K 3/35613 |
| | | | | | 327/52 |
| 6,922,083 | B2 * | 7/2005 | Tanaka | ............. | H03K 3/356139 |
| | | | | | 327/217 |
| 6,940,315 | B2 * | 9/2005 | Wang | ..................... | G11C 7/062 |
| | | | | | 327/52 |
| 9,106,189 | B2 * | 8/2015 | Lin | ........................ | H03F 3/3022 |
| 9,531,352 | B1 * | 12/2016 | Aw | .................... | H03K 3/356113 |
| 10,199,007 | B2 * | 2/2019 | Tsuchi | .................... | H03F 3/303 |

FOREIGN PATENT DOCUMENTS

KR  1020170045768 A  4/2017

* cited by examiner

*Primary Examiner* — Dinh T Le
(74) *Attorney, Agent, or Firm* — William Park & Associates Ltd.

(57) ABSTRACT

A latched comparator includes a first amplification circuit, a second amplification circuit and a latch circuit. The first amplification circuit changes voltage levels of first and second output nodes based on first and second input signals when an operation speed of a semiconductor apparatus is relatively slow. The second amplification circuit changes voltage levels of third and fourth output nodes based on the first and second input signals when the operation speed of the semiconductor apparatus is relatively fast. The latch circuit generates first and second latch signals based on the voltage levels of the first and second output nodes or based on the voltage levels of the third and fourth output nodes according to the operation speed of the semiconductor apparatus.

38 Claims, 8 Drawing Sheets

LATCHED COMPARATOR, CLOCK GENERATION CIRCUIT AND SEMICONDUCTOR APPARATUS RELATING TO THE LATCHED COMPARATOR

CROSS-REFERENCES TO RELATED APPLICATION

The present application claims priority under 35 U.S.C. § 119(a) to Korean application number 10-2019-0018492, filed on Feb. 18, 2019, in the Korean Intellectual Property Office, which is incorporated herein by reference in its entirety.

BACKGROUND

1. Technical Field

Various embodiments of the present disclosure generally relate to an integrated circuit technology and, more particularly, to a semiconductor apparatus configured to generate a clock signal.

2. Related Art

An electronic device includes a lot of electronic elements, and a computer system includes lots of semiconductor apparatuses each comprising a semiconductor. Semiconductor apparatuses configuring a computer system may communicate with each other by receiving and transmitting a clock signal and data. The semiconductor apparatuses may operate in synchronization with a clock signal. In general, master devices such as a processor and a controller may generate a system clock signal through a clock generation circuit such as a phase locked loop circuit. Slave devices such as a memory device may receive the system clock signal through a clock bus, the system clock signal being generated by the master devices. The slave devices may receive the system clock signal and may generate an internal clock signal from the system clock signal. For example, the memory device may include an internal clock generation circuit and may generate internal clock signals having various phases from the system clock signal.

SUMMARY

In an embodiment, a latched comparator may include a first amplification circuit, a second amplification circuit, and a latch circuit. The first amplification circuit may be configured to change one between voltage levels of a first output node and a second output node to a first voltage level by amplifying a first input signal and a second input signal based on a frequency detection signal. The second amplification circuit may be configured to change one between voltage levels of a third output node and a fourth output node to a second voltage level by amplifying the first input signal and the second input signal based on the frequency detection signal. The second voltage level may be lower than the first voltage level. The latch circuit may be configured to generate a first latch signal and a second latch signal based on the voltage levels of the first output node and the second output node or generate the first latch signal and the second latch signal based on the voltage levels of the third output node and the fourth output node, based on the frequency detection signal and the second enable signal.

In an embodiment, a latched comparator may include an amplification circuit and a latch circuit. The amplification circuit may be configured to change one between voltage levels of a first output node and a second output node to a first voltage level based on a first input signal and a second input signal when voltage levels of the first input signal and the second input signal are within a first range, and change one between voltage levels of a third output node and a fourth output node to a second voltage level based on the first input signal and the second input signal when the voltage levels of the first input signal and the second input signal are within a second range higher than the first range. The second voltage level may be lower than the first voltage level. The latch circuit may be configured to generate a first latch signal and a second latch signal based on the voltage levels of the first output node and the second output node when the voltage levels of the first input signal and the second input signal are within the first range, and generate the first latch signal and the second latch signal based on the voltage levels of the third output node and the fourth output node when the voltage levels of the first input signal and the second input signal are within the second range.

In an embodiment, a semiconductor apparatus may include a frequency detector, a duty detector, a first amplification circuit, a second amplification circuit, and a latch circuit. The frequency detector may be configured to generate a frequency detection signal by detecting a frequency of a clock signal. The duty detector may be configured to generate a first detection signal and a second detection signal having voltage levels within one between a first range and a second range based on at least two internal clock signals. The first amplification circuit may be configured to change voltage levels of a first output node and a second output node by amplifying the first detection signal and the second detection signal having the voltage levels within the first range based on the frequency detection signal. The second amplification circuit may be configured to change voltage levels of a third output node and a fourth output node by amplifying the first detection signal and the second detection signal having the voltage levels within the second range based on the frequency detection signal. The latch circuit may be configured to generate a first latch signal and a second latch signal based on the voltage levels of the first output node and the second output node or generate the first latch signal and the second latch signal based on the voltage levels of the third output node and the fourth output node, based on the frequency detection signal.

DETAILED DESCRIPTION

In the description of the present disclosure, the terms "first" and "second" may be used to describe various components/signals, but the components/signals are not limited by the terms. The terms may be used to distinguish one component/signal from another component/signal. For example, a first component/signal may be called a second component/signal and a second component/signal may be called a first component/signal without departing from the scope of the present disclosure.

Hereinafter, a semiconductor apparatus according to the present disclosure will be described below with reference to the accompanying drawings through embodiments.

Figure 1:
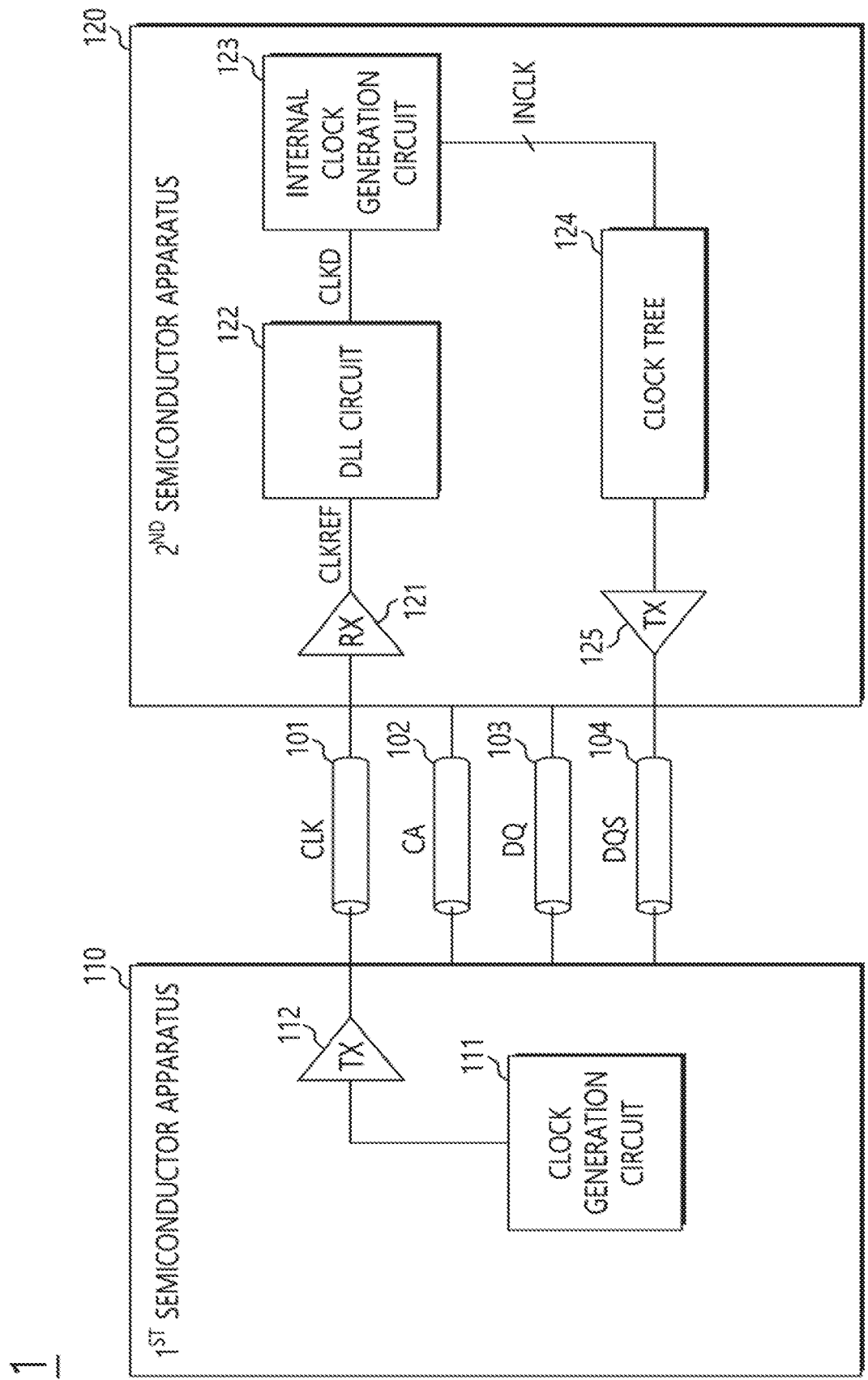
FIG. 1 is a diagram illustrating a configuration of a semiconductor system in accordance with an embodiment.

FIG. 1 is a diagram illustrating a configuration of a semiconductor system 1 in accordance with an embodiment. Referring to FIG. 1, the semiconductor system 1 may include a first semiconductor apparatus 110 and a second semiconductor apparatus 120. The first semiconductor apparatus 110 may provide various control signals required for the second semiconductor apparatus 120 to operate. The first semiconductor apparatus 110 may include various types of devices. For example, the first semiconductor apparatus 110 may be a host device such as a central processing unit (CPU), a graphic processing unit (GPU), a multi-media processor (MMP), a digital signal processor, an application processor (AP) and a memory controller. For example, the second semiconductor apparatus 120 may be a memory device and the memory device may include a volatile memory and a non-volatile memory. The volatile memory may include a static random access memory (static RAM: SRAM), a dynamic RAM (DRAM) and a synchronous DRAM (SDRAM). The non-volatile memory may include a read only memory (ROM), a programmable ROM (PROM), an electrically erasable and programmable ROM (EEPROM), an electrically programmable ROM (EPROM), a flash memory, a phase change RAM (PRAM), a magnetic RAM (MRAM), a resistive RAM (RRAM), a ferroelectric RAM (FRAM) and so forth.

The second semiconductor apparatus 120 may be electrically coupled to the first semiconductor apparatus 110 through a plurality of buses. The plurality of buses may be a signal transmission path, a link or a channel for transferring a signal. The plurality of buses may include a clock bus 101, a command address bus 102, a data bus 103, a data strobe bus 104, and so forth. Each of the clock bus 101 and the command address bus 102 may be a one-way bus and the data bus 103 and the data strobe bus 104 may be a two-way bus. The second semiconductor apparatus 120 may be electrically coupled to the first semiconductor apparatus 110 through the clock bus 101 and may receive a system clock signal CLK from the first semiconductor apparatus 110 through the clock bus 101. The system clock signal CLK may be transmitted as a single ended signal and may be transmitted, as a differential signal, with a complementary signal. The second semiconductor apparatus 120 may be electrically coupled to the first semiconductor apparatus 110 through the command address bus 102 and may receive a command address signal CA from the first semiconductor apparatus 110 through the command address bus 102. The command address signal CA may include a plurality of bits. The second semiconductor apparatus 120 may receive the command address signal CA in synchronization with the system clock signal CLK. The second semiconductor apparatus 120 may be electrically coupled to the first semiconductor apparatus 110 through the data bus 103 and may receive data DQ from the first semiconductor apparatus 110 and transmit data DQ to the first semiconductor apparatus 110 through the data bus 103. The second semiconductor apparatus 120 may be electrically coupled to the first semiconductor apparatus 110 through the data strobe bus 104 and may receive data strobe signal DQS from the first semiconductor apparatus 110 and transmit data strobe signal DQS to the first semiconductor apparatus 110 through the data strobe bus 104. The data strobe signal DQS may be a clock signal synchronized with the data DQ, and may be transmitted in synchronization with a transmission timing of the data DQ when the data DQ is transmitted between the first semiconductor apparatus 110 and the second semiconductor apparatus 120.

The first semiconductor apparatus 110 may include a clock generation circuit 111 and a clock transmitter (TX) 112. The clock generation circuit 111 may generate the system clock signal CLK. The clock generation circuit 111 may include a clock generator such as a phase locked loop circuit. The clock transmitter 112 may be electrically coupled to the clock bus 101 and may drive the clock bus 101. The clock transmitter 112 may transmit the system clock signal CLK to the second semiconductor apparatus 120 by driving the clock bus 101 based on an output of the clock generation circuit 111.

The second semiconductor apparatus 120 may include a clock receiver (RX) 121, a delay locked loop (DLL) circuit 122, an internal clock generation circuit 123, a clock tree 124 and a data strobe transmitter (TX) 125. The clock receiver 121 may be electrically coupled to the clock bus 101 and may receive the system clock signal CLK through the clock bus 101, the system clock signal CLK being transmitted from the first semiconductor apparatus 110. The clock receiver 121 may generate a reference clock signal CLKREF by receiving the system clock signal CLK. The delay locked loop circuit 122 may generate a delayed clock signal CLKD by delaying the reference clock signal CLKREF. The delay locked loop circuit 122 may compensate a delay caused while the second semiconductor apparatus 120 receives the system clock signal CLK. The delay locked loop circuit 122 may include a replica, which is modelled on a delay occurring within the second semiconductor apparatus 120, and may generate the delayed clock signal CLKD by delaying the reference clock signal CLKREF.

The internal clock generation circuit 123 may generate a plurality of internal clock signals INCLK by receiving the delayed clock signal CLKD. The internal clock generation circuit 123 may generate the plurality of internal clock signals INCLK having different phases from the delayed clock signal CLKD. For example, the internal clock generation circuit 123 may generate four internal clock signals INCLK respectively having phases of 0°, 90°, 180° and 270°. The internal clock generation circuit 123 may detect duty ratios of the plurality of internal clock signals INCLK and may correct the duty ratios of the plurality of internal clock signals INCLK. For example, the internal clock generation circuit 123 may correct the duty ratios of the plurality of internal clock signals INCLK such that the duty ratio of a high-level interval and a low-level interval of the internal clock signal INCLK is 50:50. The internal clock generation circuit 123 may generate the plurality of internal clock signals INCLK by dividing the delayed clock signal CLKD. For example, the internal clock generation circuit 123 may generate the plurality of internal clock signals INCLK having lower frequency than the delayed clock signal CLKD by halving a frequency of the delayed clock signal CLKD.

The clock tree 124 may delay the plurality of internal clock signals INCLK. The clock tree 124 may delay the plurality of internal clock signals INCLK such that the plurality of internal clock signals INCLK are synchronized with the data DQ output from the second semiconductor apparatus 120. The data strobe transmitter 125 may receive the output of the clock tree 124. The data strobe transmitter 125 may be electrically coupled to the data strobe bus 104. The data strobe transmitter 125 may transmit the data strobe signal DQS to the first semiconductor apparatus 110 by driving the data strobe bus 104 based on the output of the clock tree 124.

Figure 2:
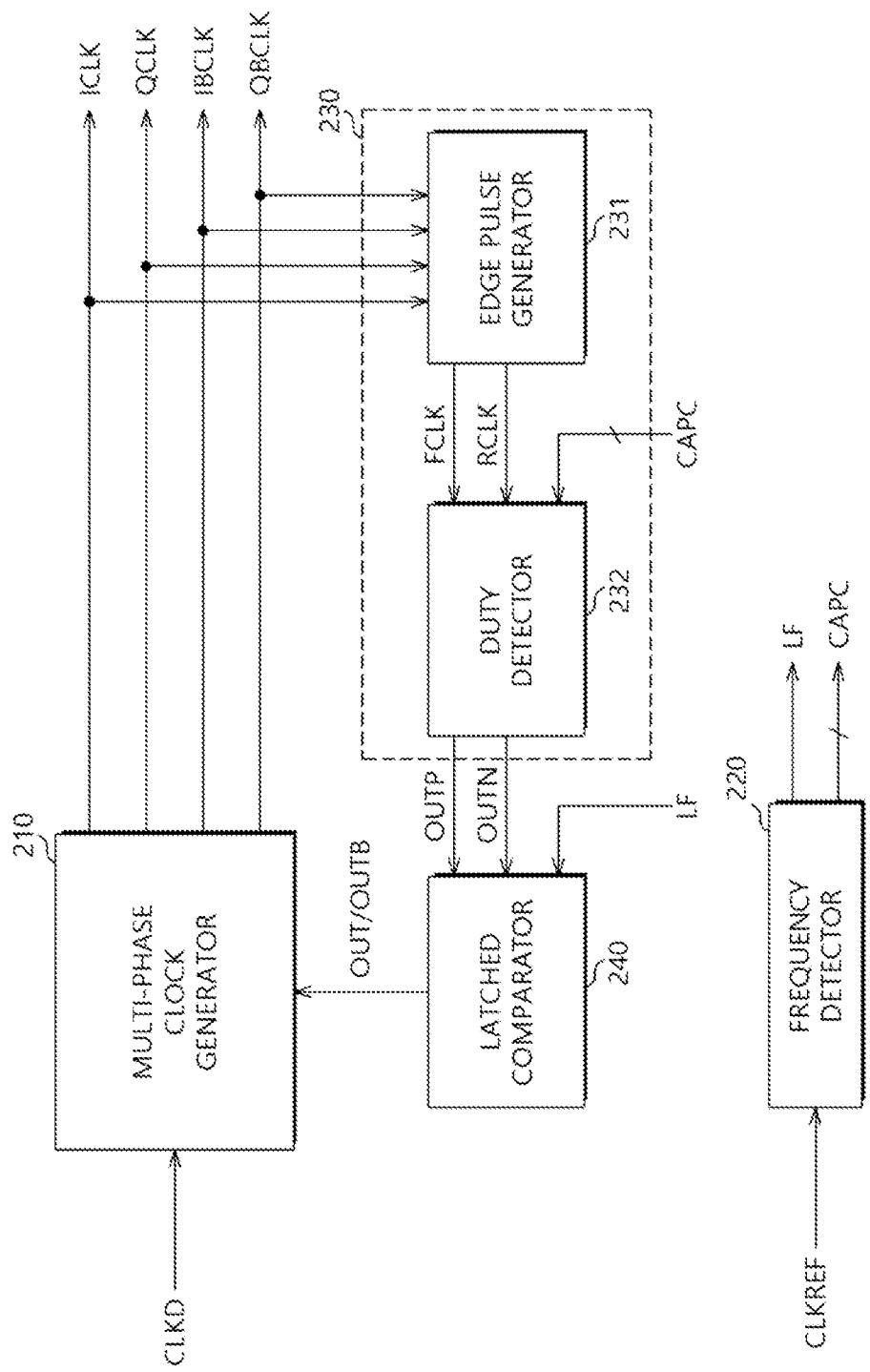
FIG. 2 is a diagram illustrating a configuration of an internal clock generation circuit within a semiconductor apparatus in accordance with an embodiment.

FIG. 2 is a diagram illustrating a configuration of an internal clock generation circuit 200 within a semiconductor apparatus in accordance with an embodiment. Elements illustrated in FIG. 2 may be applied as the internal clock generation circuit 123 of the second semiconductor apparatus 120 illustrated in FIG. 1. Also, at least a part or a whole of the elements configuring the internal clock generation circuit 200 may be disposed within the first semiconductor apparatus 110. Referring to FIG. 2, the internal clock generation circuit 200 may include a multi-phase clock generator 210, a frequency detector 220, a duty detection circuit 230 and a latched comparator 240. The multi-phase clock generator 210 may generate a first internal clock signal ICLK, a second internal clock signal QCLK, a third internal clock signal IBCLK and a fourth internal clock signal QBCLK by receiving the delayed clock signal CLKD output from the delay locked loop circuit 122 illustrated in FIG. 1. The multi-phase clock generator 210 may generate, from the delayed clock signal CLKD, the first to fourth internal clock signals ICLK, QCLK, IBCLK and QBCLK respectively having phases of 0°, 90°, 180° and 270°, two among a sequence of the first to fourth internal clock signals ICLK, QCLK, IBCLK and QBCLK having a phase difference of 90° from each other. For example, the second internal clock signal QCLK may have a lagging phase of 90° from the first internal clock signal ICLK, the third internal clock signal IBCLK may have a lagging phase of 90° from the second internal clock signal QCLK and the fourth internal clock signal QBCLK may have a lagging phase of 90° from the third internal clock signal IBCLK. The first internal clock signal ICLK may have a lagging phase of 90° from the fourth internal clock signal QBCLK. Although FIG. 2 provides, for example, the multi-phase clock generator 210 for generating four internal clock signals INCLK (i.e., first to fourth internal clock signals ICLK, QCLK, IBCLK and QBCLK), the multi-phase clock generator 210 may be modified to generate two or eight internal clock signals INCLK.

The multi-phase clock generator 210 may generate the first to fourth internal clock signals ICLK, QCLK, IBCLK and QBCLK by halving the frequency of the delayed clock signal CLKD. The frequency of the delayed clock signal CLKD may be twice as greater as the frequency of the first to fourth internal clock signals ICLK, QCLK, IBCLK and QBCLK. The phase difference between two among the sequence of the first to fourth internal clock signals ICLK, QCLK, IBCLK and QBCLK may correspond to a half of a period of the delayed clock signal CLKD. The multi-phase clock generator 210 may include a clock division circuit configured to divide the frequency of the delayed clock signal CLKD. The multi-phase clock generator 210 may receive an output signal OUT from the latched comparator 240. The output signal OUT may be input together with a complementary signal OUTB into the multi-phase clock generator 210. The multi-phase clock generator 210 may adjust delay amounts and/or the duty ratios of the first to fourth internal clock signals ICLK, QCLK, IBCLK and QBCLK based on the output signal OUT.

The frequency detector 220 may detect an operation speed of the semiconductor apparatus. The frequency detector 220 may detect the operation speed of the semiconductor apparatus based on the system clock signal CLK. The frequency detector 220 may receive the reference clock signal CLKREF, which is generated by receiving the system clock signal CLK, and may generate a frequency detection signal LF and a capacitance control signal CAPC by detecting a frequency of the reference clock signal CLKREF. The frequency detection signal LF may be enabled at a high level and the capacitance control signal CAPC may be a code signal including a plurality of bits. For example, when the reference clock signal CLKREF has a high frequency, the frequency detector 220 may disable the frequency detection signal LF and increase a code value of the capacitance control signal CAPC. When the reference clock signal CLKREF has a frequency lower than the high frequency, the frequency detector 220 may enable the frequency detection signal LF and decrease the code value of the capacitance control signal CAPC.

The duty detection circuit 230 may receive the first to fourth internal clock signals ICLK, QCLK, IBCLK and QBCLK and the capacitance control signal CAPC. The duty detection circuit 230 may generate a first detection signal OUTP and a second detection signal OUTN by detecting the duty ratios of the first to fourth internal clock signals ICLK, QCLK, IBCLK and QBCLK. The duty detection circuit 230 may generate the first detection signal OUTP and the second detection signal OUTN by comparing the phases of at least two internal clock signals among the first to fourth internal clock signals ICLK, QCLK, IBCLK and QBCLK. For example, the duty detection circuit 230 may generate the first detection signal OUTP and the second detection signal OUTN by comparing the phases of the first internal clock signal ICLK and the third internal clock signal IBCLK. The duty detection circuit 230 may generate the first detection signal OUTP and the second detection signal OUTN by comparing the phases of the second internal clock signal QCLK and the fourth internal clock signal QBCLK. However, the duty detection circuit 230 may be modified to detect a duty ratio by comparing the phases of two or more internal clock signals among the first to fourth internal clock signals ICLK, QCLK, IBCLK and QBCLK. In an embodiment, the duty detection circuit 230 may generate the first detection signal OUTP and the second detection signal OUTN by comparing the phases of the first internal clock signal ICLK and the second internal clock signal QCLK, comparing the phases of the second internal clock signal QCLK and the fourth internal clock signal QBCLK and comparing the phases of the fourth internal clock signal QBCLK and the first internal clock signal ICLK.

The duty detection circuit 230 may generate the first detection signal OUTP and the second detection signal OUTN, which have voltage levels within one between first and second ranges, based on the frequency of the reference clock signal CLKREF. For example, when the reference clock signal CLKREF has a low frequency, the duty detection circuit 230 may generate the first detection signal OUTP and the second detection signal OUTN, which have voltage levels within the first range. When the reference clock signal CLKREF has a high frequency, the duty detection circuit 230 may generate the first detection signal OUTP and the second detection signal OUTN, which have voltage levels within the second range. The voltage levels within the second range may be higher than the voltage levels within the first range.

The duty detection circuit 230 may include an edge pulse generator 231 and a duty detector 232. The edge pulse generator 231 may receive the first to fourth internal clock signals ICLK, QCLK, IBCLK and QBCLK and may generate a first edge pulse signal FCLK and a second edge pulse signal RCLK based on at least a part of the first to fourth internal clock signals ICLK, QCLK, IBCLK and QBCLK. The edge pulse generator 231 may generate the first edge pulse signal FCLK and the second edge pulse signal RCLK based on at least two internal clock signals. For example, the edge pulse generator 231 may generate the first edge pulse signal FCLK having a logic high level during an interval from a rising edge of the first internal clock signal ICLK to a rising edge of the third internal clock signal IBCLK, which has the phase difference of 180° from the first internal clock signal ICLK. The edge pulse generator 231 may generate the second edge pulse signal RCLK having a logic high level during an interval from a rising edge of the third internal clock signal IBCLK to the rising edge of the first internal clock signal ICLK.

Figure 3:
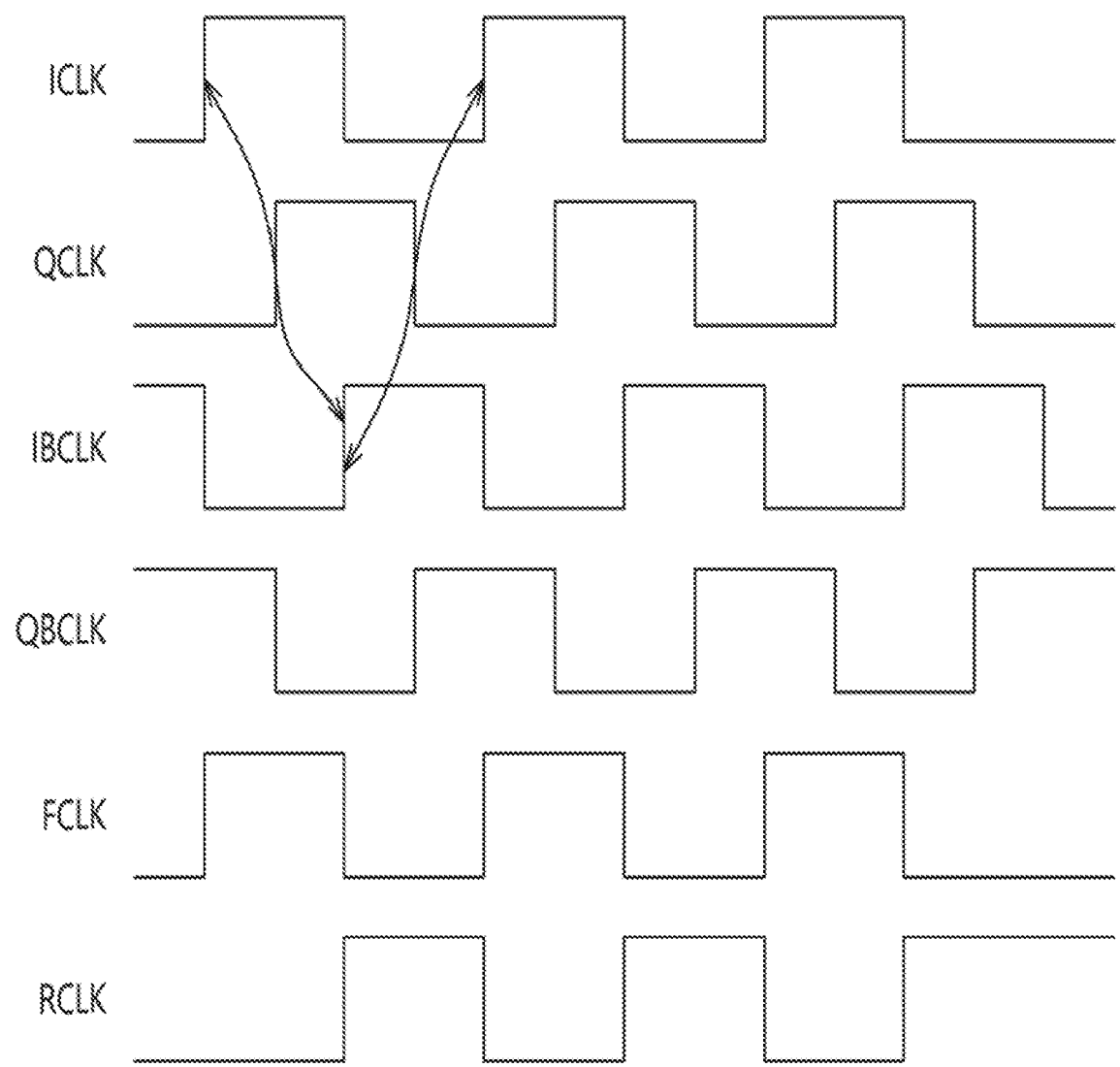
FIG. 3 is a diagram illustrating an operation of an edge pulse generator illustrated in FIG. 2.

FIG. 3 is a diagram illustrating an operation of the edge pulse generator 231 illustrated in FIG. 2. As illustrated in FIG. 3, the first internal clock signal ICLK may have a leading phase of 90° from the second internal clock signal QCLK, the second internal clock signal QCLK may have a leading phase of 90° from the third internal clock signal IBCLK, the third internal clock signal IBCLK may have a leading phase of 90° from the fourth internal clock signal QBCLK and the fourth internal clock signal QBCLK may have a leading phase of 90° from the first internal clock signal ICLK. FIG. 3 illustrates, for example, the first edge pulse signal FCLK and the second edge pulse signal RCLK generated on the basis of the first internal clock signal ICLK and the third internal clock signal IBCLK. The edge pulse generator 231 may generate the first edge pulse signal FCLK having a logic high level during the interval from the rising edge of the first internal clock signal ICLK to the rising edge of the third internal clock signal IBCLK. The edge pulse generator 231 may generate the second edge pulse signal RCLK having a logic high level during the interval from the rising edge of the third internal clock signal IBCLK to the rising edge of the first internal clock signal ICLK. The edge pulse generator 231 may generate the edge pulse signal corresponding to the interval between the rising edges of the two internal clock signals such that difference is detected between the duty ratios of the two internal clock signals. When there is difference between the duty ratios of the first internal clock signal ICLK and the third internal clock signal IBCLK, a pulse width of the high level of the first edge pulse signal FCLK may be different from a pulse width of the high level of the second edge pulse signal RCLK.

Referring back to FIG. 2, the duty detector 232 may receive the first edge pulse signal FCLK, the second edge pulse signal RCLK and the capacitance control signal CAPC. The duty detector 232 may adjust capacitances of nodes for outputting the first detection signal OUTP and the second detection signal OUTN based on the capacitance control signal CAPC. For example, the duty detector 232 may relatively increase the capacitances of the nodes based on the capacitance control signal CAPC when the reference clock signal CLKREF has a low frequency. The duty detector 232 may relatively decrease the capacitances of the nodes based on the capacitance control signal CAPC when the reference clock signal CLKREF has a high frequency. More will be described later. The duty detector 232 may generate the first detection signal OUTP and the second detection signal OUTN by discharging voltages of the nodes based on the first edge pulse signal FCLK and the second edge pulse signal RCLK. The duty detector 232 may generate the first detection signal OUTP and the second detection signal OUTN, which have different voltage levels from each other, according to durations of high level intervals of the first edge pulse signal FCLK and the second edge pulse signal RCLK.

The latched comparator 240 may receive the frequency detection signal LF, the first detection signal OUTP and the second detection signal OUTN. The latched comparator 240 may generate the output signal OUT based on the frequency detection signal LF, the first detection signal OUTP and the second detection signal OUTN. As will be described later, the latched comparator 240 may include a plurality of configuration elements and may generate the output signal OUT from the first detection signal OUTP and the second detection signal OUTN by mainly activating selected elements among the configuration elements based on the frequency detection signal LF. The latched comparator 240 may generate the output signal OUT by mainly activating a part of the configuration elements when the first detection signal OUTP and the second detection signal OUTN have voltage levels within the first range, and may generate the output signal OUT by mainly activating another part of the configuration elements when the first detection signal OUTP and the second detection signal OUTN have voltage levels within the second range.

Figure 4:
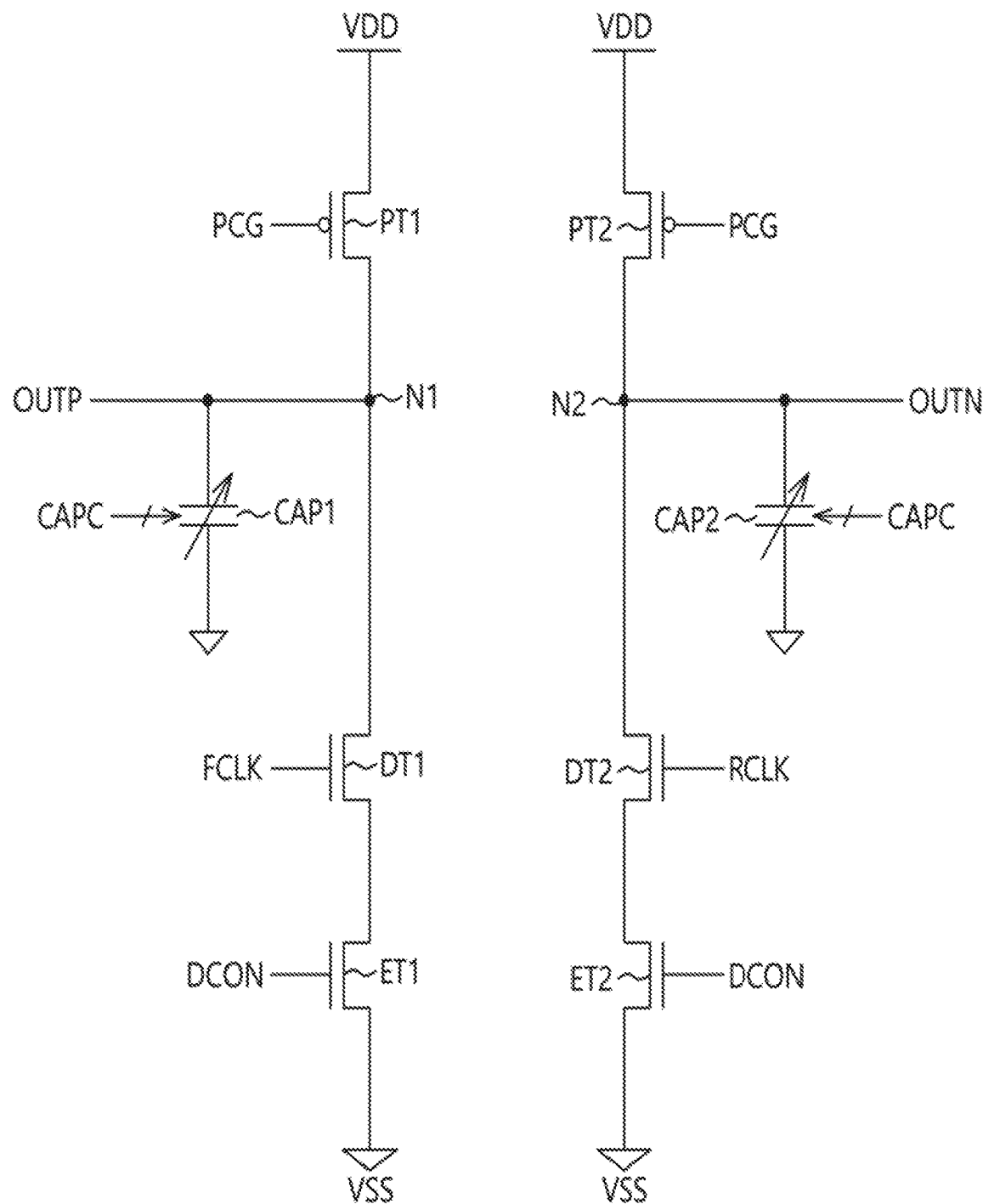
FIG. 4 is a diagram illustrating a configuration of a duty detector illustrated in FIG. 2.

FIG. 4 is a diagram illustrating a configuration of the duty detector 232 illustrated in FIG. 2. Referring to FIG. 4, the duty detector 232 may include a first discharge transistor DT1, a second discharge transistor DT2, a first enable transistor ET1, a second enable transistor ET2, a first precharge transistor PT1, a second precharge transistor PT2, a first capacitor CAP1 and a second capacitor CAP2. The first discharge transistor DT1 may be electrically coupled between a first node N1 and a ground voltage node VSS and may receive the first edge pulse signal FCLK. The second discharge transistor DT2 may be electrically coupled between a second node N2 and the ground voltage node VSS and may receive the second edge pulse signal RCLK. The first enable transistor ET1 may receive a first enable signal DCON and may electrically couple the first discharge transistor DT1 to the ground voltage node VSS based on the first enable signal DCON. The second enable transistor ET2 may receive the first enable signal DCON and may electrically couple the second discharge transistor DT2 to the ground voltage node VSS based on the first enable signal DCON. The first enable signal DCON may be enabled when the duty detection circuit 230 performs the duty detection operation. The first precharge transistor PT1 may provide a power voltage VDD to the first node N1 based on a precharge signal PCG. The second precharge transistor PT2 may provide the power voltage VDD to the second node N2 based on the precharge signal PCG. The precharge signal PCG may be enabled to precharge the first node N1 and the second node N2 before the first edge pulse signal FCLK and the second edge pulse signal RCLK are provided.

The first capacitor CAP1 may be electrically coupled to the first node N1 at one end and may be electrically coupled to the ground voltage node VSS at the other end. The second capacitor CAP2 may be electrically coupled to the second node N2 at one end and may be electrically coupled to the ground voltage node VSS at the other end. The capacitances of the first capacitor CAP1 and the second capacitor CAP2 may be the same as each other. The first capacitor CAP1 and the second capacitor CAP2 may receive the capacitance control signal CAPC and may have capacitances varied according to the capacitance control signal CAPC. For example, the first capacitor CAP1 and the second capacitor CAP2 may have large capacitances according to the capacitance control signal CAPC having a large code value and may have small capacitances according to the capacitance control signal CAPC having a small code value.

Figure 5:
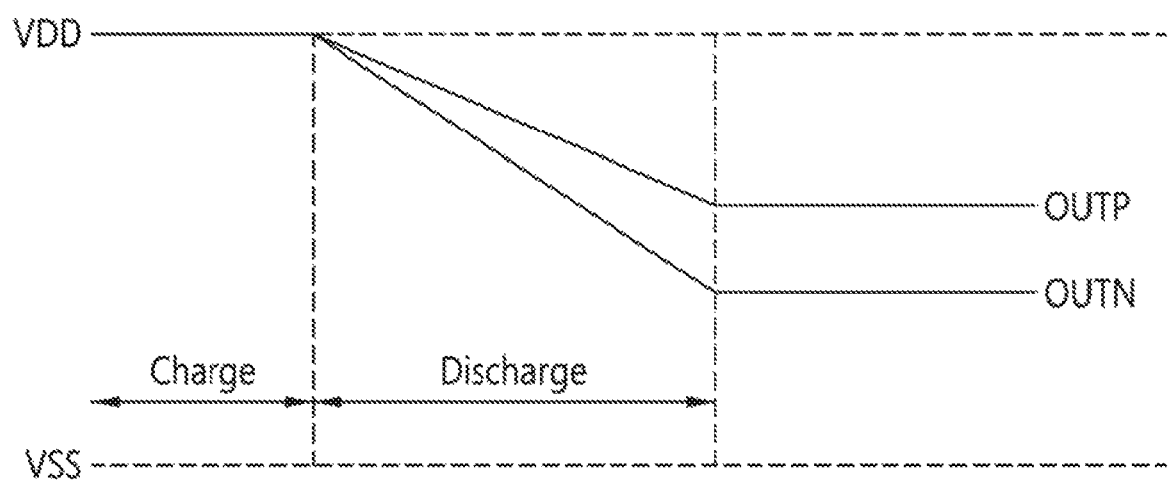
FIG. 5 is a diagram illustrating an operation of the duty detector illustrated in FIG. 4.

FIG. 5 is a diagram illustrating an operation of the duty detector 232 illustrated in FIG. 4. Described with reference to FIGS. 4 and 5 will be the operation of the duty detector 232 as follows. When the duty detector 232 performs the duty detection operation, the precharge signal PCG and the first enable signal DCON may be enabled. The first precharge transistor PT1 and the second precharge transistor PT2 may drive the first node N1 and the second node N2 to the power voltage VDD, respectively, and the first capacitor CAP1 and the second capacitor CAP2 respectively coupled to the first node N1 and the second node N2 may be charged to the voltage level of the power voltage VDD. The first detection signal OUTP and the second detection signal OUTN may have voltage levels corresponding to the power voltage VDD. The first enable transistor ET1 and the second enable transistor ET2 may respectively form current paths from the first discharge transistor DT1 and the second discharge transistor DT2 to the ground voltage node VSS when the first enable signal DCON is enabled. The first discharge transistor DT1 and the second discharge transistor DT2 may be turned on when the first edge pulse signal FCLK and the second edge pulse signal RCLK are provided. During a high level interval of the first edge pulse signal FCLK, a current may flow from the first node N1 to the ground voltage node VSS through the first discharge transistor DT1 and thus the first capacitor CAP1 may be discharged. During a high level interval of the second edge pulse signal RCLK, a current may flow from the second node N2 to the ground voltage node VSS through the second discharge transistor DT2 and thus the second capacitor CAP2 may be discharged. When the a high level interval of the second edge pulse signal RCLK is longer than the a high level interval of the first edge pulse signal FCLK, the second capacitor CAP2 may be discharged by a greater amount than the first capacitor CAP1 and the voltage level of the first node N1 may be relatively higher than the voltage level of the second node N2. Therefore, the first detection signal OUTP and the second detection signal OUTN may be generated to have different voltage levels from each other.

Figure 6A:
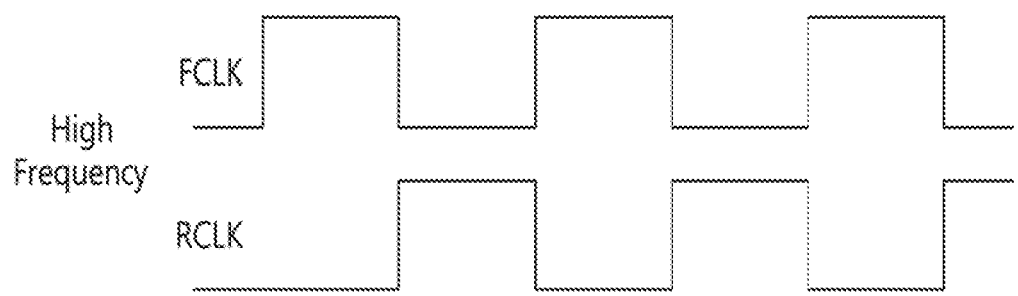
FIG. 6A is a diagram illustrating waveforms of first and second edge pulse signals according to an operation speed of the semiconductor apparatus.
Figure 6A:
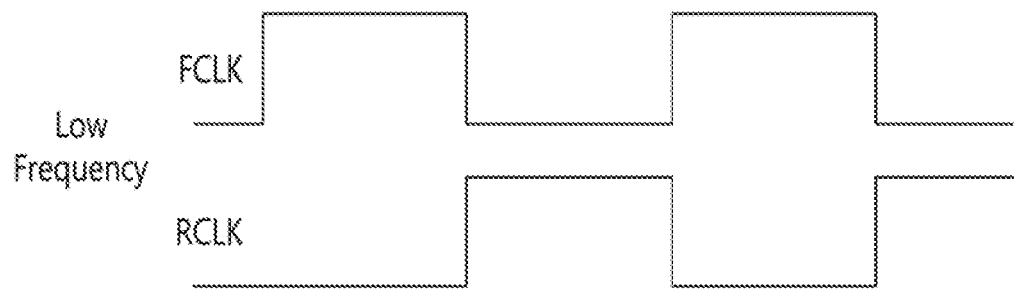
Figure 6B:
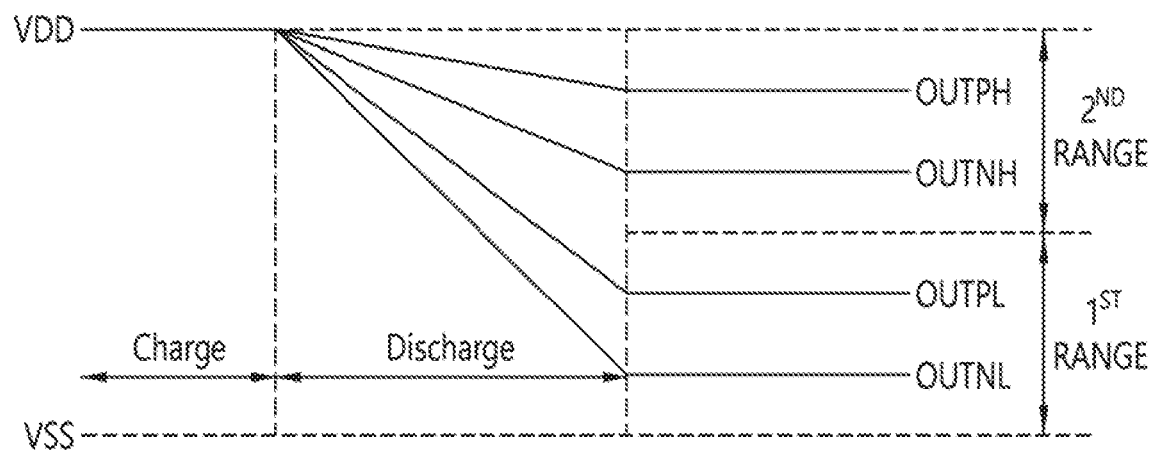
FIG. 6B is a diagram illustrating voltage levels of first and second detection signals according to the first and second edge pulse signals illustrated in FIG. 6A.

FIG. 6A is a diagram illustrating waveforms of the first edge pulse signal FCLK and the second edge pulse signal RCLK according to an operation speed of the semiconductor apparatus, and FIG. 6B is a diagram illustrating voltage levels of the first detection signal OUTP and the second detection signal OUTN according to the first edge pulse signal FCLK and the second edge pulse signal RCLK illustrated in FIG. 6A. Referring to FIG. 6A, frequencies of the system clock signal CLK and the reference clock signal CLKREF may become greater as the operation speed of the semiconductor apparatus becomes greater. The frequencies of the first to fourth internal clock signals ICLK, QCLK, IBCLK and QBCLK generated when the frequency of the reference clock signal CLKREF is high may be greater than the frequencies of the first to fourth internal clock signals ICLK, QCLK, IBCLK and QBCLK generated when the frequency of the reference clock signal CLKREF is low. Therefore, the pulse widths of the first edge pulse signal FCLK and the second edge pulse signal RCLK may be relatively narrow when the frequency of the reference clock signal CLKREF is relatively high. On the contrary, the pulse widths of the first edge pulse signal FCLK and the second edge pulse signal RCLK may be relatively wide when the frequency of the reference clock signal CLKREF is relatively low.

Referring to FIGS. 5, 6A and 6B, it cannot be guaranteed that the duty detector 232 will operate well in all-frequency environments when the first capacitor CAP1 and the capacitor CAP2 are assumed to have fixed capacitances. The capacitors may be discharged during the high level intervals of the first edge pulse signal FCLK and the second edge pulse signal RCLK because an amount of discharge may be different according to the pulse widths of the first edge pulse signal FCLK and the second edge pulse signal RCLK. That is, a lesser amount of charge may be discharged as the pulse widths of the first edge pulse signal FCLK and the second edge pulse signal RCLK becomes narrower and a greater amount of charge may be discharged as the pulse widths of the first edge pulse signal FCLK and the second edge pulse signal RCLK becomes wider. When the capacitances of the first capacitor CAP1 and the second capacitor CAP2 are too small, there may occur a problem that the voltage levels of the first detection signal OUTP and the second detection signal OUTN are lowered to the ground voltage level VSS due to the first edge pulse signal FCLK and the second edge pulse signal RCLK generated when the frequency of the reference clock signal CLKREF is relatively low. Therefore, the first capacitor CAP1 and the second capacitor CAP2 of the duty detector 232 may have capacitances varied according to the capacitance control signal CAPC. The first capacitor CAP1 and the second capacitor CAP2 may have relatively large capacitances when the frequency of the reference clock signal CLKREF is relatively low. The first capacitor CAP1 and the second capacitor CAP2 may have relatively small capacitances when the frequency of the reference clock signal CLKREF is relatively high. However, the maximum capacitances of the first capacitor CAP1 and the second capacitor CAP2 of the duty detector 232 may be limited and thus the voltage levels of the first detection signal OUTP and the second detection signal OUTN may vary according to the pulse widths of the first edge pulse signal FCLK and the second edge pulse signal RCLK even when the capacitances of the first capacitor CAP1 and the second capacitor CAP2 are adjusted. For example, the voltage levels of the first detection signal OUTP and the second detection signal OUTN may be higher when the frequency of the reference clock signal CLKREF is higher than the voltage levels of the first detection signal OUTP and the second detection signal OUTN when the frequency of the reference clock signal CLKREF is low. As illustrated in FIG. 6B, the duty detector 232 may generate the first detection signal OUTPL and the second detection signal OUTNL having voltage levels within the first range when the frequency of the reference clock signal CLKREF is low and may generate the first detection signal OUTPH and the second detection signal OUTNH having voltage levels within the second range when the frequency of the reference clock signal CLKREF is high. The voltage levels within the second range may be higher than the voltage levels within the first range.

Figure 7:
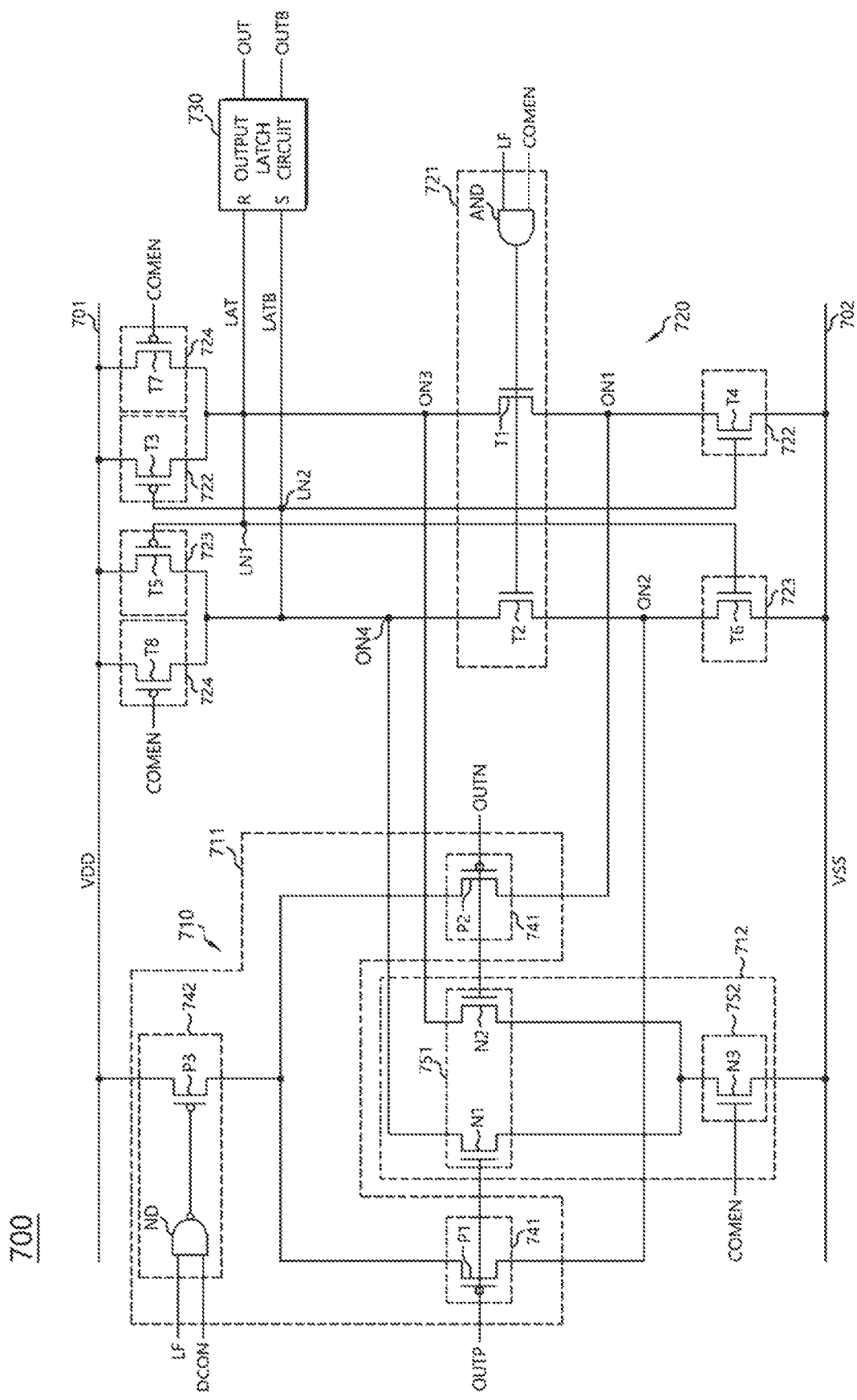
FIG. 7 is a diagram illustrating a configuration of a latched comparator in accordance with an embodiment.

FIG. 7 is a diagram illustrating a configuration of a latched comparator 700 in accordance with an embodiment. The latched comparator 700 may be applied as the latched comparator 240 illustrated in FIG. 2. The latched comparator 700 may receive the first detection signal OUTP as a first input signal and may receive the second detection signal OUTN as a second input signal. Hereinafter, the first input signal and the first detection signal OUTP may be the same signal and the second input signal and the second detection signal OUTN may be the same signal. The latched comparator 700 may generate a first latch signal LAT and a second latch signal LATB based on the first input signal OUTP and the second input signal OUTN and may generate the output signal OUT based on the first latch signal LAT and the second latch signal LATB. The latched comparator 700 may include an amplification circuit 710 and a latch circuit 720. The amplification circuit 710 may amplify the first input signal OUTP and the second input signal OUTN. The latch circuit 720 may generate the first latch signal LAT and the second latch signal LATB by latching the amplification result of the amplification circuit 710. The amplification circuit 710 may operate according to the first enable signal DCON and a second enable signal COMEN and the latch circuit 720 may operate according to the second enable signal COMEN. For example, the second enable signal COMEN may be generated on the basis of the reference clock signal CLKREF. For example, the amplification circuit 710 may perform an amplification operation to the first input signal OUTP and the second input signal OUTN while the second enable signal COMEN has a high level. The latch circuit 720 may generate the first latch signal LAT and the second latch signal LATB by latching the signal amplified by the amplification circuit 710 while the second enable signal COMEN has a low level.

The amplification circuit 710 may change voltage levels of a first output node ON1 and a second output node ON2 based on the first input signal OUTP and the second input signal OUTN when the first input signal OUTP and the second input signal OUTN have the voltage levels within the first range. The amplification circuit 710 may change one between the voltage levels of the first output node ON1 and the second output node ON2 to a first voltage level by amplifying the first input signal OUTP and the second input signal OUTN. The amplification circuit 710 may change voltage levels of a third output node ON3 and a fourth output node ON4 based on the first input signal OUTP and the second input signal OUTN when the first input signal OUTP and the second input signal OUTN have the voltage levels within the second range. The amplification circuit 710 may change one between the voltage levels of the third output node ON3 and the fourth output node ON4 to a second voltage level by amplifying the first input signal OUTP and the second input signal OUTN. The first voltage level may be higher than the second voltage level. The first voltage level may correspond to a voltage level of a first voltage VDD and the second voltage level may correspond to a voltage level of a second voltage VSS. For example, the first voltage VDD may be a power voltage that the latched comparator 700 receives and the second voltage VSS may have a lower level than the power voltage and may be a ground voltage. The latched comparator 700 may be provided with the first voltage VDD through a first voltage rail 701 and may be provided with the second voltage VSS through a second voltage rail 702. The frequency detection signal LF may have information about the ranges, within which the voltage levels of the first input signal OUTP and the second input signal OUTN are. The amplification circuit 710 may provide the pair of the first output node ON1 and the second output node ON2 or the pair of the third output node ON3 and the fourth output node ON4 with the amplification results of the first input signal OUTP and the second input signal OUTN according to the frequency detection signal LF.

The latch circuit 720 may generate the first latch signal LAT and the second latch signal LATB based on the voltage levels of the first output node ON1 and the second output node ON2 or the voltage levels of the third output node ON3 and the fourth output node ON4 according to the frequency detection signal LF. The latch circuit 720 may generate the first latch signal LAT and the second latch signal LATB based on the voltage levels of the first output node ON1 and the second output node ON2 when the voltage levels of the first input signal OUTP and the second input signal OUTN are within the first range. The latch circuit 720 may generate the first latch signal LAT and the second latch signal LATB based on the voltage levels the third output node ON3 and the fourth output node ON4 when the voltage levels of the first input signal OUTP and the second input signal OUTN are within the second range.

The latched comparator 700 may further include an output latch circuit 730. The output latch circuit 730 may generate the output signal OUT by receiving the first latch signal LAT and the second latch signal LATB. The output latch circuit 730 may enable the output signal OUT based on the first latch signal LAT and the second latch signal LATB. For example, the output latch circuit 730 may enable the output signal OUT and disable a complementary signal OUTB of the output signal OUT when the second latch signal LATB is enabled. The output latch circuit 730 may disable the output signal OUT and enable the complementary signal OUTB when the first latch signal LAT is enabled. The output latch circuit 730 may be implemented by a RS latch configured to receive the second latch signal LATB at a set node S, receive the first latch signal LAT at a reset node R and output the output signal OUT and the complementary signal OUTB.

The amplification circuit 710 may include a first amplification circuit 711 and a second amplification circuit 712. The first amplification circuit 711 may change the voltage levels of the first output node ON1 and the second output node ON2 based on the first input signal OUTP and the second input signal OUTN when the voltage levels of the first input signal OUTP and the second input signal OUTN are within the first range. The first amplification circuit 711 may change one between the voltage levels of the first output node ON1 and the second output node ON2 to the first voltage level based on the first input signal OUTP and the second input signal OUTN. The first amplification circuit 711 may change one between the voltage levels of the first output node ON1 and the second output node ON2 to the first voltage level by amplifying the first input signal OUTP and the second input signal OUTN based on the frequency detection signal LF and the first enable signal DCON. The first amplification circuit 711 may change one between the voltage levels of the first output node ON1 and the second output node ON2 to the first voltage level based on the first input signal OUTP and the second input signal OUTN when the frequency detection signal LF is enabled.

The first amplification circuit 711 may include a first differential circuit 741 and a first voltage switching circuit 742. The first differential circuit 741 may be a P-type amplification circuit having a P-channel MOS transistor. The first differential circuit 741 may change the voltage levels of the first output node ON1 and the second output node ON2 by amplifying the first input signal OUTP and the second input signal OUTN. The first voltage switching circuit 742 may be electrically coupled to the first voltage rail 701. The first voltage switching circuit 742 may provide the first voltage VDD to the first differential circuit 741 based on the frequency detection signal LF and the first enable signal DCON. For example, the first voltage switching circuit 742 may provide the first voltage VDD to the first differential circuit 741 when both of the frequency detection signal LF and the first enable signal DCON are enabled. The first differential circuit 741 may change, when the first voltage VDD is provided from the first voltage switching circuit 742, the voltage levels of the first output node ON1 and the second output node ON2 by amplifying the first input signal OUTP and the second input signal OUTN.

The first differential circuit 741 may include a first P-channel MOS transistor P1 and a second P-channel MOS transistor P2. The first P-channel MOS transistor P1 may receive the first input signal OUTP and may change the voltage level of the second output node ON2 to the first voltage level. The second P-channel MOS transistor P2 may receive the second input signal OUTN and may change the voltage level of the first output node ON1 to the first voltage level. The first P-channel MOS transistor P1 may receive the first input signal OUTP at its gate and may be electrically coupled to the second output node ON2 at its drain. The second P-channel MOS transistor P2 may receive the second input signal OUTN at its gate, may be electrically coupled to the first output node ON1 at its drain and may be electrically coupled to a source of the first P-channel MOS transistor P1 at its source.

The first voltage switching circuit 742 may include a NAND gate ND and a third P-channel MOS transistor P3. The NAND gate ND may receive the frequency detection signal LF and the first enable signal DCON. The third P-channel MOS transistor P3 may receive an output of the NAND gate ND at its gate, may be electrically coupled to the first voltage rail 701 at its source to receive the first voltage VDD and may be electrically coupled to the sources of the first P-channel MOS transistor P1 and the second P-channel MOS transistor P2 at its drain.

The second amplification circuit 712 may change the voltage levels of the third output node ON3 and the fourth output node ON4 based on the first input signal OUTP and the second input signal OUTN when the voltage levels of the first input signal OUTP and the second input signal OUTN are within the second range. The second amplification circuit 712 may change one between the voltage levels of the third output node ON3 and the fourth output node ON4 to the second voltage level based on the first input signal OUTP and the second input signal OUTN. The second amplification circuit 712 may change one between the voltage levels of the third output node ON3 and the fourth output node ON4 to the second voltage level by amplifying the first input signal OUTP and the second input signal OUTN based on the second enable signal COMEN. The second amplification circuit 712 may change one between the voltage levels of the third output node ON3 and the fourth output node ON4 to the second voltage level based on the first input signal OUTP and the second input signal OUTN when the frequency detection signal LF is disabled.

The second amplification circuit 712 may include a second differential circuit 751 and a second voltage switching circuit 752. The second differential circuit 751 may be a N-type amplification circuit having a N-channel MOS transistor. The second differential circuit 751 may change the voltage levels of the third output node ON3 and the fourth output node ON4 by amplifying the first input signal OUTP and the second input signal OUTN. The second voltage switching circuit 752 may be electrically coupled to the second voltage rail 702. The second voltage switching circuit 752 may provide the second voltage VSS to the second differential circuit 751 based on the second enable signal COMEN. For example, the second voltage switching circuit 752 may provide the second voltage VSS to the second differential circuit 751 when the second enable signal COMEN are enabled to a high level. The second differential circuit 751 may change, when the second voltage VSS is provided from the second voltage switching circuit 752, the voltage levels of the third output node ON3 and the fourth output node ON4 by amplifying the first input signal OUTP and the second input signal OUTN.

The second differential circuit 751 may include a first N-channel MOS transistor N1 and a second N-channel MOS transistor N2. The first N-channel MOS transistor N1 may receive the first input signal OUTP and may change the voltage level of the fourth output node ON4 to the second voltage level. The second N-channel MOS transistor N2 may receive the second input signal OUTN and may change the voltage level of the third output node ON3 to the second voltage level. The first N-channel MOS transistor N1 may receive the first input signal OUTP at its gate and may be electrically coupled to the fourth output node ON4 at its drain. The second N-channel MOS transistor N2 may receive the second input signal OUTN at its gate, may be electrically coupled to the third output node ON3 at its drain and may be electrically coupled to a source of the first N-channel MOS transistor N1 at its source.

The second voltage switching circuit 752 may include a third N-channel MOS transistor N3. The third N-channel MOS transistor N3 may receive the second enable signal COMEN at its gate, may be electrically coupled to the second voltage rail 702 at its source to receive the second voltage VSS and may be electrically coupled to the sources of the first N-channel MOS transistor N1 and the N-channel MOS transistor N2 at its drain.

The latch circuit 720 may include a node switching circuit 721, a first inverting circuit 722 and a second inverting circuit 723. The node switching circuit 721 may electrically couple the first output node ON1 and the second output node ON2 to the third output node ON3 and the fourth output node ON4, respectively, based on the frequency detection signal LF and the second enable signal COMEN. The third output node ON3 may be electrically coupled to a first latch node LN1 and the fourth output node ON4 may be electrically coupled to a second latch node LN2. The first latch signal LAT may be output from the first latch node LN1 and the second latch signal LATB may be output from the second latch node LN2. The node switching circuit 721 may electrically couple the first output node ON1 to the first latch node LN1 and may electrically couple the second output node ON2 to the second latch node LN2 when the frequency detection signal LF and the second enable signal COMEN are enabled. The node switching circuit 721 may electrically de-couple the first output node ON1 from the first latch node LN1 and may electrically de-couple the second output node ON2 from the second latch node LN2 when the frequency detection signal LF is disabled. Therefore, when the frequency detection signal LF is enabled and the voltage levels of the first input signal OUTP and the second input signal OUTN are within the first range, the node switching circuit 721 may electrically couple the first output node ON1 and the second output node ON2 respectively to the first latch node LN1 and the second latch node LN2. Voltage levels of the first latch node LN1 and the second latch node LN2 may be changed on the basis of the voltage levels of the first output node ON1 and the second output node ON2. The latch circuit 720 may generate the first latch signal LAT and the second latch signal LATB through the first latch node LN1 and the second latch node LN2 based on the voltage levels of the first output node ON1 and the second output node ON2. When the frequency detection signal LF is disabled and the voltage levels of the first input signal OUTP and the second input signal OUTN are within the second range, the node switching circuit 721 may electrically de-couple the first output node ON1 and the second output node ON2 respectively from the first latch node LN1 and the second latch node LN2. Therefore, the latch circuit 720 may generate the first latch signal LAT and the second latch signal LATB through the first latch node LN1 and the second latch node LN2 based on the voltage levels of the third output node ON3 and the fourth output node ON4.

The first inverting circuit 722 may latch the voltage level of the first latch node LN1 by inverting the voltage level of the second latch node LN2 and may output the first latch signal LAT through the first latch node LN1. The second inverting circuit 723 may latch the voltage level of the second latch node LN2 by inverting the voltage level of the first latch node LN1 and may output the second latch signal LATB through the second latch node LN2.

The latch circuit 720 may further include a precharge circuit 724. The precharge circuit 724 may receive the second enable signal COMEN. The precharge circuit 724 may precharge the voltage levels of the first latch node LN1 and the second latch node LN2 to the first voltage level when the second enable signal COMEN is disabled. The precharge circuit 724 may be electrically coupled to the first voltage rail 701 to receive the first voltage VDD and may provide, when the second enable signal COMEN is disabled, the first voltage VDD to the first latch node LN1 and the second latch node LN2.

The node switching circuit 721 may include an AND gate AND, a first transistor T1 and a second transistor T2. The AND gate AND may receive the frequency detection signal LF and the second enable signal COMEN and may output, when both of the frequency detection signal LF and the second enable signal COMEN are enabled to a high level, a signal of a high level. The first transistor T1 and the second transistor T2 may be N-channel MOS transistors. The first transistor T1 may receive the output of the AND gate AND at its gate, may be electrically coupled to the third output node ON3 and the first latch node LN1 at its drain and may be electrically coupled to the first output node ON1 at its source. The second transistor T2 may receive the output of the AND gate AND at its gate, may be electrically coupled to the fourth output node ON4 and the second latch node LN2 at its drain and may be electrically coupled to the second output node ON2 at its source.

The first inverting circuit 722 may include a third transistor T3 and a fourth transistor T4. The third transistor T3 may be a P-channel MOS transistor and the fourth transistor T4 may be a N-channel MOS transistor. The third transistor T3 may be electrically coupled to the second latch node LN2 at its gate, may receive the first voltage VDD at its source and may be electrically coupled to the first latch node LN1 and the third output node ON3 at its drain. The fourth transistor T4 may be electrically coupled to the second latch node LN2 at its gate, may receive the second voltage VSS at its source and may be electrically coupled to the second output node ON2 at its drain.

The second inverting circuit 723 may include a fifth transistor T5 and a sixth transistor T6. The fifth transistor T5 may be a P-channel MOS transistor and the sixth transistor T6 may be a N-channel MOS transistor. The fifth transistor T5 may be electrically coupled to the first latch node LN1 at its gate, may receive the first voltage VDD at its source and may be electrically coupled to the second latch node LN2 and the fourth output node ON4 at its drain. The sixth transistor T6 may be electrically coupled to the first latch node LN1 at its gate, may receive the second voltage VSS at its source and may be electrically coupled to the second output node ON2 at its drain.

The precharge circuit 724 may include a seventh transistor T7 and an eighth transistor T8. The seventh transistor T7 and the eighth transistor T8 may be P-channel MOS transistors. The seventh transistor T7 may receive the second enable signal COMEN at its gate, may receive the first voltage VDD at its source and may be electrically coupled to the first latch node LN1 at its drain. The eighth transistor T8 may receive the second enable signal COMEN at its gate, may receive the first voltage VDD at its source and may be electrically coupled to the second latch node LN2 at its drain.

Hereinafter, described with reference to FIGS. 2 and 7 will be an operation of the latched comparator 700 in accordance with an embodiment of the present disclosure. When the operation speed of the semiconductor apparatus is relatively slow and the frequency of the reference clock signal CLKREF is relatively low, the frequency detector 220 may enable the frequency detection signal LF. The duty detection circuit 230 may detect the duty ratios of the first to fourth internal clock signals ICLK, QCLK, IBCLK and QBCLK and may generate the first detection signal OUTP and the second detection signal OUTN (i.e., the first input signal OUTP and the second input signal OUTN) having the voltage levels within the first range. The first voltage switching circuit 742 may provide the first voltage VDD to the first differential circuit 741 based on the frequency detection signal LF and the first enable signal DCON. Therefore, the first differential circuit 741 may change the voltage levels of the first output node ON1 and the second output node ON2 by amplifying the first detection signal OUTP and the second detection signal OUTN. Although the second differential circuit 751 as the N-type amplification circuit is provided with the second voltage VSS from the second voltage switching circuit 752, the second differential circuit 751 may not amplify the first detection signal OUTP and the second detection signal OUTN since the voltage levels of the first detection signal OUTP and the second detection signal OUTN are within the first range. Based on the frequency detection signal LF and the second enable signal COMEN, the node switching circuit 721 may electrically couple the first output node ON1 to the third output node ON3 and the first latch node LN1 and may electrically couple the second output node ON2 to the fourth output node ON4 and the second latch node LN2. The voltage levels of the first latch node LN1 and the second latch node LN2 may be actively changed by the voltage levels of the first output node ON1 and the second output node ON2, which are changed by the first differential circuit 741. The first inverting circuit 722 may maintain the voltage level of the first latch node LN1 based on the voltage level of the second latch node LN2. The second inverting circuit 723 may maintain the voltage level of the second latch node LN2 based on the voltage level of the first latch node LN1. The output latch circuit 730 may generate the output signal OUT and the complementary signal OUTB based on the first latch signal LAT and the second latch signal LATB, which are output through the third output node ON3 and the fourth output node ON4.

When the operation speed of the semiconductor apparatus is relatively fast and the frequency of the reference clock signal CLKREF is relatively high, the frequency detector 220 may disable the frequency detection signal LF. The duty detection circuit 230 may detect the duty ratios of the first to fourth internal clock signals ICLK, QCLK, IBCLK and QBCLK and may generate the first detection signal OUTP and the second detection signal OUTN having the voltage levels within the second range. The first voltage switching circuit 742 may not provide the first voltage VDD to the first differential circuit 741 based on the frequency detection signal LF and the first enable signal DCON. Therefore, the first differential circuit 741 may be de-activated. The second differential circuit 751 may change the voltage levels of the third output node ON3 and the fourth output node ON4 based on the first detection signal OUTP and the second detection signal OUTN. Based on the frequency detection signal LF, the node switching circuit 721 may electrically de-couple the first output node ON1 from the third output node ON3 such that the first output node ON1 is electrically isolated from the first latch node LN1. The node switching circuit 721 may electrically de-couple the second output node ON2 from the fourth output node ON4 such that the second output node ON2 is electrically isolated from the second latch node LN2. Therefore, the fourth transistor T4 of the first inverting circuit 722 may affect the voltage level of the first latch node LN1 and the sixth transistor T6 of the second inverting circuit 723 may not affect the voltage level of the second latch node LN2. The third transistor T3 of the first inverting circuit 722 may drive the first latch node LN1 to the first voltage level based on the voltage levels of the fourth output node ON4 and the second latch node LN2. The fifth transistor T5 of the second inverting circuit 723 may maintain the voltage level of the second latch node LN2 based on the voltage levels of the third output node ON3 and the first latch node LN1. The output latch circuit 730 may generate the output signal OUT and the complementary signal OUTB based on the first latch signal LAT and the second latch signal LATB, which are output through the third output node ON3 and the fourth output node ON4.

Figure 8:
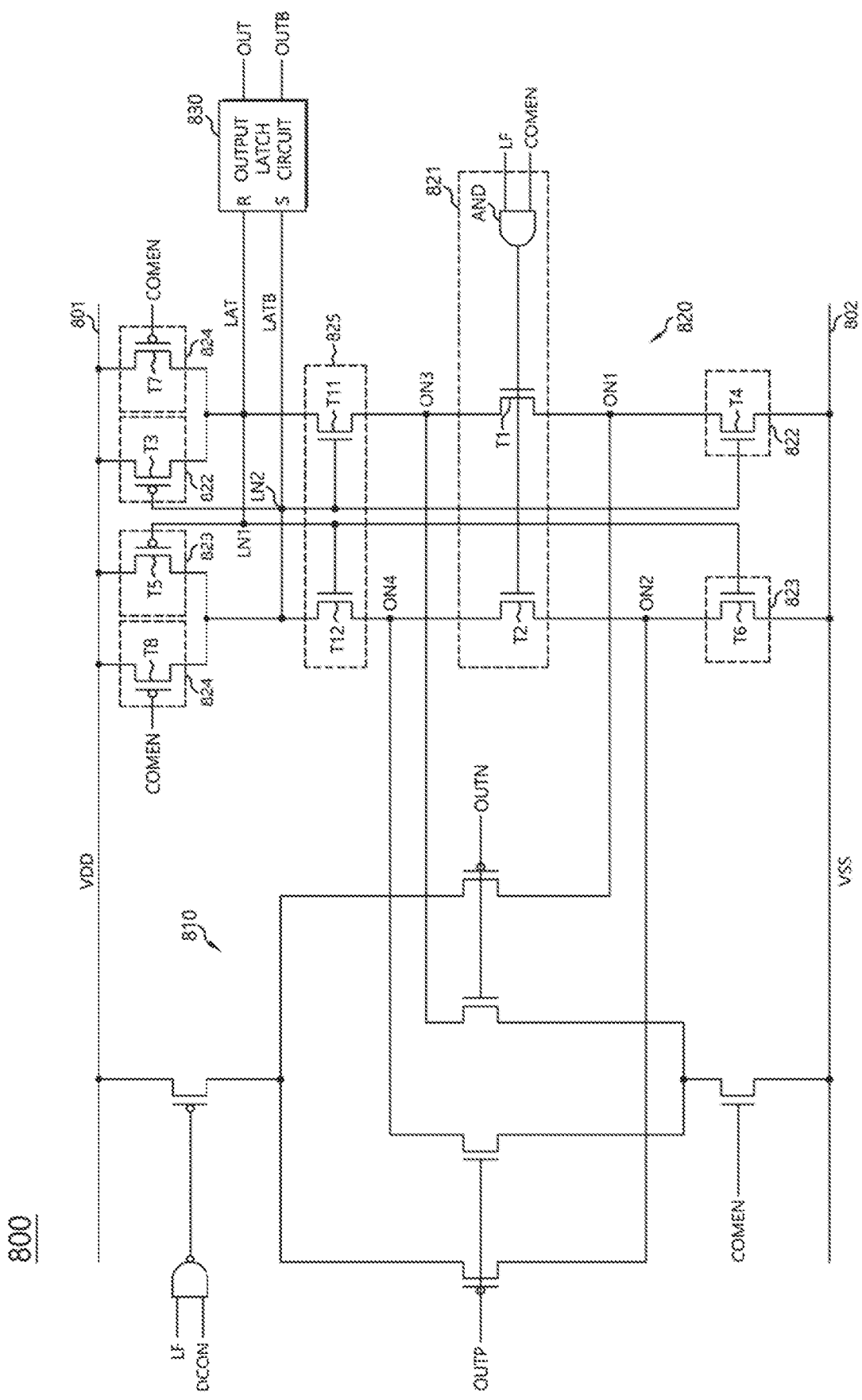
FIG. 8 is a diagram illustrating a configuration of a latched comparator in accordance with an embodiment.

FIG. 8 is a diagram illustrating a configuration of a latched comparator 800 in accordance with an embodiment. The latched comparator 800 may be electrically coupled between a first voltage rail 801 and a second voltage rail 802 to operate. The latched comparator 800 may include an amplification circuit 810, a latch circuit 820 and an output latch circuit 830. The latch circuit 820 may include a node switching circuit 821, a first inverting circuit 822, a second inverting circuit 823, a precharge circuit 824 and a current path blocking circuit 825. The latched comparator 800 may have the same configuration elements as the latched comparator 700 except that the latch circuit 820 further includes the current path blocking circuit 825 between the third output node ON3 and the fourth output node ON4 and the first latch node LN1 and the second latch node LN2. Therefore, similar reference numerals are assigned to the same configuration elements and repetitive description for the same configuration elements will be omitted.

The current path blocking circuit 825 may electrically couple the third output node ON3 and the fourth output node ON4 respectively to the first latch node LN1 and the second latch node LN2 based on the voltage levels of the first latch node LN1 and the second latch node LN2. The current path blocking circuit 825 may block at least one current leakage path through the first latch node LN1 and the second latch node LN2 when one between the voltage levels of the first latch node LN1 and the second latch node LN2 changes. The current path blocking circuit 825 may firmly maintain the voltage levels of the first latch node LN1 and the second latch node LN2 and may prevent unnecessary power consumption by blocking the current leakage path through the first latch node LN1 and the second latch node LN2.

The current path blocking circuit 825 may include a first transistor T11 and a second transistor T12. The first transistor T11 and the second transistor T12 may be N-channel MOS transistors. The first transistor T11 may be electrically coupled to the second latch node LN2 at its gate, may be electrically coupled to the first latch node LN1 at its drain and may be electrically coupled to the third output node ON3 at its source. The second transistor T12 may be electrically coupled to the first latch node LN1 at its gate, may be electrically coupled to the second latch node LN2 at its drain and may be electrically coupled to the fourth output node ON4 at its source.

When the second enable signal COMEN is disabled, the precharge circuit 824 may precharge the first latch node LN1 and the second latch node LN2 to the first voltage level. The first transistor T11 and the second transistor T12 may electrically couple the first latch node LN1 to the third output node ON3 and may electrically couple the second latch node LN2 to the fourth output node ON4 based on the voltage levels of the precharged first latch node LN1 and second latch node LN2. When the second enable signal COMEN is enabled, the amplification circuit 810 may operate and the amplification circuit 810 may change one between the voltage levels of the first output node ON1 and the second output node ON2 or may change one between the voltage levels of the third output node ON3 and the fourth output node ON4 based on the first input signal OUTP and the second input signal OUTN. For example, when the voltage level of the second output node ON2 is lowered, the voltage level of the second latch node LN2 may be lowered and the first transistor T11 may be turned off. When the first transistor T11 is turned off, the third output node ON3 may be electrically de-coupled from the first latch node LN1 and the leakage path from the first latch node LN1 to the second voltage rail 802 may be blocked. Therefore, the voltage level of the first latch node LN1 may be firmly maintained to the first voltage level. On the other hand, when the voltage level of the first output node ON1 is lowered, the voltage level of the first latch node LN1 may be lowered and the second transistor T12 may be turned off. When the second transistor T12 is turned off, the fourth output node ON4 may be electrically de-coupled from the second latch node LN2 and the leakage path from the second latch node LN2 to the second voltage rail 802 may be blocked. Therefore, the voltage level of the second latch node LN2 may be firmly maintained to the first voltage level. Therefore, when the latch circuit 820 further includes the current path blocking circuit 825, the voltage levels of the first latch signal LAT and the second latch signal LATB may be stably maintained and unnecessary power consumption may be prevented.

While certain embodiments have been described above, it will be understood to those skilled in the art that the embodiments described are by way of example only. Accordingly, the latched comparator, clock signal generating circuit and semiconductor apparatus using the latched comparator should not be limited based on the described embodiments. Rather, the latched comparator, internal clock signal generation circuit and semiconductor apparatus using the latched comparator described herein should only be limited in light of the claims that follow when taken in conjunction with the above description and accompanying drawings.

What is claimed is:

1. A latched comparator comprising:
   a first amplification circuit configured to change voltage levels of a first output node and a second output node to a first voltage level by amplifying a first input signal and a second input signal when a frequency detection signal is enabled;
   a second amplification circuit configured to change voltage levels of a third output node and a fourth output node to a second voltage level by amplifying the first input signal and the second input signal when the frequency detection signal is disabled, the second voltage level being lower than the first voltage level; and
   a latch circuit configured to generate a first latch signal and a second latch signal based on the voltage levels of the first output node and the second output node when the frequency detection signal is enabled and generate the first latch signal and the second latch signal based on the voltage levels of the third output node and the fourth output node when the frequency detection signal is disabled.

2. The latched comparator of claim 1, wherein the first amplification circuit includes:
   a first differential circuit configured to change voltage levels of the first output node and the second output node to the first voltage level based on the first input signal and the second input signal; and
   a first voltage switching circuit configured to provide a first voltage having the first voltage level to the first differential circuit based on the frequency detection signal.

3. The latched comparator of claim 2, wherein the first differential circuit includes:
   a first P-channel MOS transistor configured to change the voltage level of the second output node to the first voltage level by receiving the first input signal; and
   a second P-channel MOS transistor configured to change the voltage level of the first output node to the first voltage level by receiving the second input signal.

4. The latched comparator of claim 1, wherein the second amplification circuit includes:
   a second differential circuit configured to change the voltage levels of the third output node and the fourth output node to the second voltage level based on the first input signal and the second input signal; and
   a second voltage switching circuit configured to provide a second voltage having the second voltage level to the second differential circuit based on an enable signal.

5. The latched comparator of claim 4, wherein the second differential circuit includes:
   a first N-channel MOS transistor configured to change the voltage level of the fourth output node to the second voltage level by receiving the first input signal; and
   a second N-channel MOS transistor configured to change the voltage level of the third output node to the second voltage level by receiving the second input signal.

6. The latched comparator of claim 1, wherein the latch circuit includes:
   a node switching circuit configured to electrically couple the first output node to the third output node and the first latch node and electrically couple the second output node to the fourth output node and the second latch node based on the frequency detection signal and an enable signal;
   a first inverting circuit configured to generate the first latch signal by latching the voltage level of the first latch node based on the voltage level of the second latch node; and
   a second inverting circuit configured to generate the second latch signal by latching the voltage level of the second latch node based on the voltage level of the first latch node.

7. The latched comparator of claim 6, wherein the latch circuit further includes a current path blocking circuit configured to block at least one current leakage path through the first latch node and the second latch node based on the voltage levels of the first latch node and the second latch node.

8. The latched comparator of claim 1, further comprising an output latch circuit configured to enable an output signal based on the second latch signal and enable a complementary signal of the output signal based on the first latch signal.

9. A latched comparator comprising:
   an amplification circuit configured to change voltage levels of a first output node and a second output node to a first voltage level based on a first input signal and a second input signal when a frequency detection signal is enabled, and change voltage levels of a third output node and a fourth output node to a second voltage level, which is lower than the first voltage level, based on the first input signal and the second input signal when the frequency detection signal is disabled, wherein the frequency detection signal is enabled when the voltage levels of the first and second input signals are within a first voltage range and the frequency detection signal is disabled when the voltage levels of the first and second inputs signals are within a second voltage range higher than the first voltage range; and
   a latch circuit configured to generate a first latch signal and a second latch signal based on the voltage levels of the first output node and the second output node when the voltage levels of the first input signal and the second input signal are within the first voltage range, and generate the first latch signal and the second latch signal based on the voltage levels of the third output node and the fourth output node when the voltage levels of the first input signal and the second input signal are within the second voltage range.

10. The latched comparator of claim 9, wherein the amplification circuit includes:
    a first differential circuit configured to change the voltage levels of the first output node and the second output node to the first voltage level based on the first input signal and the second input signal;
    a first voltage switching circuit configured to provide a first voltage having the first voltage level to the first differential circuit based on the frequency detection signal;
    a second differential circuit configured to change the voltage levels of the third output node and the fourth output node to the second voltage level based on the first input signal and the second input signal; and
    a second voltage switching circuit configured to provide a second voltage having the second voltage level to the second differential circuit based on an enable signal.

11. The latched comparator of claim 10, wherein the first differential circuit includes:
    a first P-channel MOS transistor configured to change the voltage level of the second output node to the first voltage level by receiving the first input signal; and a second P-channel MOS transistor configured to change the voltage level of the first output node to the first voltage level by receiving the second input signal.

12. The latched comparator of claim 10, wherein the second differential circuit includes:
a first N-channel MOS transistor configured to change the voltage level of the fourth output node to the second voltage level by receiving the first input signal; and
a second N-channel MOS transistor configured to change the voltage level of the third output node to the second voltage level by receiving the second input signal.

13. The latched comparator of claim 9,
wherein the latch circuit generates the first latch signal and the second latch signal based on the voltage levels of the first output node and the second output node based on the enable signal when the frequency detection signal is enabled, and
wherein the latch circuit generates the first latch signal and the second latch signal based on the voltage levels of the third output node and the fourth output node based on the enable signal when the frequency detection signal is disabled.

14. The latched comparator of claim 9, wherein the latch circuit includes:
a node switching circuit configured to electrically couple the first output node to the third output node and a first latch node and electrically couple the second output node to the fourth output node and a second latch node based on a frequency detection signal and the enable signal;
a first inverting circuit configured to generate the first latch signal by latching the voltage level of the first latch node based on the voltage level of the second latch node; and
a second inverting circuit configured to generate the second latch signal by latching the voltage level of the second latch node based on the voltage level of the first latch node.

15. The latched comparator of claim 14, wherein the latch circuit further includes a current path blocking circuit configured to block at least one leakage path through the first latch node and the second latch node based on the voltage levels of the first latch node and the second latch node.

16. The latched comparator of claim 9, further comprising an output latch circuit configured to enable an output signal based on the second latch signal and enable a complementary signal of the output signal based on the first latch signal.

17. A semiconductor apparatus comprising:
a frequency detector configured to generate a frequency detection signal by detecting a frequency of a clock signal;
a duty detector configured to generate a first detection signal and a second detection signal having voltage levels within one between a first voltage range and a second range based on at least two internal clock signals;
a first amplification circuit configured to change voltage levels of a first output node and a second output node by amplifying the first detection signal and the second detection signal, from the duty detector, having the voltage levels within the first range based on the frequency detection signal from the frequency detector;
a second amplification circuit configured to change voltage levels of a third output node and a fourth output node by amplifying the first detection signal and the second detection signal, from the duty detector, having the voltage levels within the second range based on the frequency detection signal from the frequency detector; and
a latch circuit configured to generate a first latch signal and a second latch signal based on the voltage levels of the first output node and the second output node or generate the first latch signal and the second latch signal based on the voltage levels of the third output node and the fourth output node, based on the frequency detection signal from the frequency detector.

18. The semiconductor apparatus of claim 17, wherein the duty detector generates the first detection signal and the second detection signal having the voltage levels within the first range when the frequency of the clock signal is a high frequency, and generates the first detection signal and the second detection signal having the voltage levels within the second range when the frequency of the clock signal is a low frequency lower than the high frequency.

19. The semiconductor apparatus of claim 17, wherein the first amplification circuit includes:
a first differential circuit configured to change one between the voltage levels of the first output node and the second output node to a first voltage level based on the first detection signal and the second detection signal; and
a first voltage switching circuit configured to provide a first voltage having the first voltage level to the first differential circuit based on the frequency detection signal and a first enable signal.

20. The semiconductor apparatus of claim 19, wherein the first differential circuit includes:
a first P-channel MOS transistor configured to change the voltage level of the second output node to the first voltage level by receiving the first detection signal; and
a second P-channel MOS transistor configured to change the voltage level of the first output node to the first voltage level by receiving the second detection signal.

21. The semiconductor apparatus of claim 17, wherein the second amplification circuit includes:
a second differential circuit configured to change one between the voltage levels of the third output node and the fourth output node to a second voltage level based on the first detection signal and the second detection signal; and
a second voltage switching circuit configured to provide a second voltage having the second voltage level to the second differential circuit based on a second enable signal.

22. The semiconductor apparatus of claim 21, wherein the second differential circuit includes:
a first N-channel MOS transistor configured to change the voltage level of the fourth output node to the second voltage level by receiving the first detection signal; and
a second N-channel MOS transistor configured to change the voltage level of the third output node to the second voltage level by receiving the second detection signal.

23. The semiconductor apparatus of claim 17,
wherein the latch circuit generates the first latch signal and the second latch signal by latching the voltage levels of the first output node and the second output node based on a second enable signal when the frequency detection signal is enabled, and
wherein the latch circuit generates the first latch signal and the second latch signal by latching the voltage levels of the third output node and the fourth output node based on the second enable signal when the frequency detection signal is disabled.

24. The semiconductor apparatus of claim 17, wherein the latch circuit includes:
- a node switching circuit configured to electrically couple the first output node to the third output node and the first latch node and electrically couple the second output node to the fourth output node and the second latch node based on the frequency detection signal and a second enable signal;
- a first inverting circuit configured to generate the first latch signal by latching the voltage level of the first latch node based on the voltage level of the second latch node; and
- a second inverting circuit configured to generate the second latch signal by latching the voltage level of the second latch node based on the voltage level of the first latch node.

25. The semiconductor apparatus of claim 24, wherein the latch circuit further includes a current path blocking circuit configured to block at least one current leakage path through the first latch node and the second latch node based on the voltage levels of the first latch node and the second latch node.

26. The semiconductor apparatus of claim 17, further comprising an output latch circuit configured to enable an output signal based on the second latch signal and enable a complementary signal of the output signal based on the first latch signal.

27. The semiconductor apparatus of claim 17, further comprising:
- a multi-phase generator configured to generate the at least two internal clock signals based on a delayed clock signal, which is generated by delaying the clock signal; and
- an edge pulse generator configured to generate a first edge pulse signal and a second edge pulse signal based on the at least two internal clock signals,
- wherein the duty detector generates the first detection signal and the second detection signal based on the first edge pulse signal and the second edge pulse signal.

28. A latched comparator comprising:
- an amplification circuit configured to change voltage levels of a first output node and a second output node to a first voltage level based on a first input signal and a second input signal when a frequency detection signal is enabled, and change voltage levels of a third output node and a fourth output node to a second voltage level, which is lower than the first voltage level, based on the first input signal and the second input signal when the frequency detection signal is disabled; and
- a latch circuit configured to generate a first latch signal and a second latch signal based on the voltage levels of the first output node and the second output node when the frequency detection signal is enabled, and generate the first latch signal and the second latch signal based on the voltage levels of the third output node and the fourth output node when the frequency detection signal is disabled.

29. The latched comparator of claim 28, wherein the frequency detection signal is enabled when the first input signal and the second input signal are within a first voltage range and the frequency detection signal is disabled when the first input signal and the second input signal are within a second voltage range higher than the first voltage range.

30. The latched comparator of claim 28, wherein the amplification circuit includes:
- a first differential circuit configured to change the voltage levels of the first output node and the second output node to the first voltage level based on the first input signal and the second input signal;
- a first voltage switching circuit configured to provide a first voltage having the first voltage level to the first differential circuit based on the frequency detection signal;
- a second differential circuit configured to change the voltage levels of the third output node and the fourth output node to the second voltage level based on the first input signal and the second input signal; and
- a second voltage switching circuit configured to provide a second voltage having the second voltage level to the second differential circuit based on an enable signal.

31. The latched comparator of claim 28, wherein the latch circuit includes:
- a node switching circuit configured to electrically couple the first output node to the third output node and a first latch node and electrically couple the second output node to the fourth output node and a second latch node based on a frequency detection signal and the enable signal;
- a first inverting circuit configured to generate the first latch signal by latching the voltage level of the first latch node based on the voltage level of the second latch node; and
- a second inverting circuit configured to generate the second latch signal by latching the voltage level of the second latch node based on the voltage level of the first latch node.

32. The latched comparator of claim 31, wherein the latch circuit further includes a current path blocking circuit configured to block at least one leakage path through the first latch node and the second latch node based on the voltage levels of the first latch node and the second latch node.

33. A latched comparator comprising:
- a first differential circuit configured to change voltage levels of a first output node and a second output node to a first voltage level based on a first input signal and a second input signal;
- a first voltage switching circuit configured to provide a first voltage having the first voltage level to the first differential circuit based on a frequency detection signal;
- a second differential circuit configured to change voltage levels of a third output node and a fourth output node to a second voltage level based on the first input signal and the second input signal;
- a second voltage switching circuit configured to provide a second voltage having the second voltage level to the second differential circuit based on an enable signal; and
- a latch circuit configured to generate a first latch signal and a second latch signal based on the voltage levels of the first output node and the second output node and generate the first latch signal and the second latch signal based on the voltage levels of the third output node and the fourth output node, based on the frequency detection signal.

34. The latched comparator of claim 33, wherein the latch circuit includes:
- a node switching circuit configured to electrically couple the first output node to the third output node and a first latch node and electrically couple the second output node to the fourth output node and a second latch node based on a frequency detection signal and the enable signal;

a first inverting circuit configured to generate the first latch signal by latching the voltage level of the first latch node based on the voltage level of the second latch node; and a second inverting circuit configured to generate the second latch signal by latching the voltage level of the second latch node based on the voltage level of the first latch node.

35. The latched comparator of claim 34, wherein the latch circuit further includes a current path blocking circuit configured to block at least one leakage path through the first latch node and the second latch node based on the voltage levels of the first latch node and the second latch node.

36. A latched comparator comprising:
    an amplification circuit configured to change voltage levels of a first output node and a second output node to a first voltage level by amplifying a first input signal and a second input signal and change voltage levels of a third output node and a fourth output node to a second voltage level, which is lower than the first voltage level, by amplifying the first input signal and the second input signal, based on a frequency detection signal;
    a node switching circuit configured to electrically couple the first output node to the third output node and a first latch node and electrically couple the second output node to the fourth output node and a second latch node based on the frequency detection signal;
    a first inverting circuit configured to generate the first latch signal by latching the voltage level of the first latch node based on the voltage level of the second latch node; and
    a second inverting circuit configured to generate the second latch signal by latching the voltage level of the second latch node based on the voltage level of the first latch node.

37. The latched comparator of claim 36, wherein the amplification circuit includes:
    a first differential circuit configured to change the voltage levels of the first output node and the second output node to the first voltage level based on the first input signal and the second input signal;
    a first voltage switching circuit configured to provide a first voltage having the first voltage level to the first differential circuit based on the frequency detection signal;
    a second differential circuit configured to change the voltage levels of the third output node and the fourth output node to the second voltage level based on the first input signal and the second input signal; and
    a second voltage switching circuit configured to provide a second voltage having the second voltage level to the second differential circuit based on an enable signal.

38. The latched comparator of claim 36, further comprising a current path blocking circuit configured to block at least one leakage path through the first latch node and the second latch node based on the voltage levels of the first latch node and the second latch node.

* * * * *